United States Patent [19]

Tokiai et al.

[11] Patent Number: 5,318,743
[45] Date of Patent: Jun. 7, 1994

[54] PROCESSES FOR PRODUCING A THERMOELECTRIC MATERIAL AND A THERMOELECTRIC ELEMENT

[75] Inventors: Takeo Tokiai, Sodegaura; Takashi Uesugi, Tokyo; Kazuyuki Fukumoto, Sodegaura; Toshitaka Ohta; Takenobu Kajikawa, both of Tsukuba, all of Japan

[73] Assignees: Idemitsu Petrochemical Co., Ltd.; Director-General, Agency of Industrial Science and Technology, Ministry of International Trade and Industry, both of Tokyo, Japan

[21] Appl. No.: 982,460

[22] Filed: Nov. 27, 1992

[51] Int. Cl.⁵ ............................................... B22F 3/16
[52] U.S. Cl. ......................................... 419/38; 419/31; 419/23; 419/42; 419/53; 419/33; 419/54
[58] Field of Search ............... 75/213, 228; 136/201; 257/64; 357/68; 419/23, 38; 437/207

[56] References Cited

U.S. PATENT DOCUMENTS

| | | | |
|---|---|---|---|
| 4,902,648 | 2/1990 | Ohta et al. | 437/247 |
| 5,108,515 | 4/1992 | Ohta et al. | 136/201 |
| 5,168,339 | 12/1992 | Yokotani | 257/64 |

FOREIGN PATENT DOCUMENTS

| | | |
|---|---|---|
| 642379 | 4/1989 | Japan . |
| 642380 | 4/1989 | Japan . |
| 03108781 | 8/1991 | Japan . |
| 03165076 | 10/1991 | Japan . |
| 03233980 | 1/1992 | Japan . |

*Primary Examiner*—Donald P. Walsh
*Assistant Examiner*—John N. Greaves
*Attorney, Agent, or Firm*—Frishauf, Holtz, Goodman & Woodward

[57] ABSTRACT

A process for producing a thermoelectric material comprises molding a material powder comprising two or more elements selected from the group consisting of bismuth, tellurium, antimony and selenium and having average diameter in the range from 0.05 to 100 μm and sintering the molded material powder with or without hot isostatic pressing. The material powder may be calcinated before the molding. A process for producing a thermoelectric element comprises cutting out pieces of a pillar-like shape from each of a p-type thermoelectric material and a n-type thermoelectric material, connecting the pieces cut out from the p-type thermoelectric material and the pieces cut out from the n-type thermoelectric material alternately with electrodes at the upper faces or the lower faces of the pieces and attaching insulating base plates to the surfaces of the electrodes. The p-type thermoelectric material and the n-type thermoelectric material are respectively produced by the process described above. The thermoelectric element has improved thermoelectric property, excellent stability of the thermoelectric property and excellent mechanical strength.

16 Claims, 6 Drawing Sheets

PROCESSES FOR PRODUCING A THERMOELECTRIC MATERIAL AND A THERMOELECTRIC ELEMENT

BACKGROUND OF THE INVENTION

1. Field of the Invention

The present invention relates to a novel process for producing a thermoelectric material and a novel process for producing a thermoelectric element utilizing it. More particularly, the present invention relates to a process for efficiently producing a thermoelectric material having excellent stability of thermoelectric property and excellent mechanical strength simultaneously by sintering a material powder with hot isostatic pressing, by calcining and then sintering the material powder or by calcining and then sintering the material powder with hot isostatic pressing.

The present invention also relates to a process for producing a thermoelectric element by utilizing the thermoelectric material produced above.

2. Description of the Related Arts

Thermoelectric elements are widely utilized as thermoelectric power generators, temperature sensors, thermoelectric coolers (poltier cooler) and the like. Various kinds of process have been proposed for producing the thermoelectric elements.

For example, a thermoelectric material comprising $FeSi_2$ and a transition metal was disclosed in Japanese Patent Publication Showa 52-47677. But, this thermoelectric material did not have the satisfactory property.

As another example, a thermoelectric material comprising lead-tellurium compounds and metals of manganese group was disclosed in Laid Open Japanese Patent Application Showa 59-143383. But, this thermoelectric element did not have the satisfactory property either.

In Laid Open Japanese Patent Application Showa 64-37456, a process of sintering solid solution powder of $Bi_2Te_3$-$Bi_2Se_3$ was disclosed. But, this process had a problem that it was complicated and not practically advantageous. As a process for solving this problem, a process of copulverizing and mixing, molding and sintering Bi-Sb and Te-Se was disclosed in Laid Open Japanese Patent Application Heisei 2-256283. However, this process had problems that uniformity of the sintered particles between the surface parts and the inner parts was not satisfactory, that stability of the thermoelectric property was not sufficient and that mechanical strength was not good either. Thus, a process for efficiently producing thermoelectric material and elements having excellent stability of thermoelectric property, excellent mechanical property and excellent stability of quality with high productivity has been desired.

Extensive investigations were made by the present inventors with the object of developing a process for efficiently producing a thermoelectric material having the excellent thermoelectric property, mechanical strength and stability of quality and a process for producing a thermoelectric element utilizing it.

And then, it was discovered that the object can be achieved by molding and sintering a material with hot isostatic pressing, by presintering and then sintering the material or by presintering and sintering the material with hot isostatic pressing. The invention was completed on the basis of this discovery.

SUMMARY OF THE INVENTION

An object of the present invention is to provide a process for producing a thermoelectric material having improved thermoelectric property and excellent stability of the thermoelectric property and a thermoelectric element utilizing it.

Another object of the present invention is to provide a process for producing a thermoelectric material having excellent mechanical property and a thermoelectric element utilizing it.

Still another object of the present invention is to provide an efficient process for producing a thermoelectric material having excellent stability of quality and a thermoelectric element utilizing it.

Thus, the present invention provides a process for producing a thermoelectric material which comprises molding a material powder comprising two or more elements selected from the group consisting of bismuth, tellurium, antimony and selenium and having an average diameter in the range from 0.05 to 100 $\mu$m and sintering the molded material powder with hot isostatic pressing (Embodiment 1).

The present invention also provides a process for producing a thermoelectric material which comprises presintering a material powder comprising two or more elements selected from the group consisting of bismuth, tellurium, antimony and selenium and having an average diameter in the range from 0.05 to 100 $\mu$m, molding the calcined material powder and sintering the molded material powder (Embodiment 2).

The present invention also provides a process for producing a thermoelectric material which comprises presintering a material powder comprising two or more elements selected from the group consisting of bismuth, tellurium, antimony and selenium and having an average diameter in the range from 0.05 to 100 $\mu$m, molding the calcined material powder and sintering the molded material powder with hot isostatic pressing (Embodiment 3).

The present invention also provides a process for producing a thermoelectric element which comprises cutting out pieces of a pillar-like shape from each of a p-type thermoelectric material and an n-type thermoelectric material, connecting the pieces cut out from the p-type thermoelectric material and the pieces cut out from the n-type thermoelectric material alternately with electrodes at the upper faces or the lower faces of the pieces and attaching insulating base plates to the surfaces of the electrodes. The p-type thermoelectric material and the n-type thermoelectric material are individually produced by copulverizing and mixing a material powder comprising two or more elements selected from the group consisting of bismuth, tellurium, antimony and selenium, molding the copulverized and mixed material powder and sintering the molded material powder with hot isostatic pressing (Embodiment 4).

Other and further objects, features and advantages of the invention will appear more fully from the following description.

BRIEF DESCRIPTION OF THE DRAWINGS

The symbols in the Figures have the meanings as listed in the following:
○: Bi-Te-Sb solid solution
△: Te
□: Sb
▽: Bi.

DESCRIPTION OF PREFERRED EMBODIMENTS

In the process of the invention, the material powder is selected from the group consisting of metallic particles of bismuth, tellurium, antimony and selenium and dopants. The material powder comprises at least two kinds of these metallic particles. These metallic particles are copulverized and fully mixed with a suitably selected ratio. It is preferable that the copulverizing and mixing are carried out simultaneously so that the particle diameter of the material powder is made small. The material powder thus obtained can be, for example, expressed as: $(Bi_2Te_3)_x(Sb_2Te_3)_y$ wherein $x+y=1$, $0<x<1$ and $0<y<1$.

The copulverizing and mixing can be carried out by utilizing means of pulverizing and mixing simultaneously, such as a ball mill, an impact grinding (mill), a jet mill, a tower mill and the like. Among these means, a ball mill is preferred. A planetary type ball mill is more preferable than a dropping type ball mill. Conditions of the material powder during the mixing may be either dry or wet. When the mixing is carried out in a wet condition, a solvent, such as an alcohol like ethanol and butanol and a like solvent, may be utilized as a mixing aid.

It is preferred that powder and time of the mixing by copulverization is adjusted so that the average diameter of the material powder after the mixing is in the range from 0.05 to 100 μm and preferably in the range from 0.05 to 30 μm. When the average diameter is larger than 100 μm, uniformity of the material powder becomes poorer and the condition is not desirable. It is preferred that the diameter of the material powder is small. However, pulverizing the particles to a diameter of smaller than 0.05 μm requires a large amount of energy and, on the other hand, the property of the material powder is not improved to the degree expected from the consumed energy. Thus, a diameter in the range from 0.05 to 30 μm is satisfactory.

It is preferable that the copulverizing and mixing are carried out simultaneously. For the copulverizing and mixing, it is preferred that a planetary type ball mill is utilized with the pulverizing power adjusted to $4 \times 10^6$ kg·m·s$^{-1}$/kg or more and more preferably in the range from $5 \times 10^6$ to $2 \times 10^7$ kg·m·s$^{-1}$/kg. The pulverizing power is defined by the following equation:

$$\text{Pulverizing power} = (1/W) \times n \times (m/d) \times V^2 \times t$$

wherein W is the amount of the material powder to be treated (kg), n is the number of balls, m is the mass of a ball (kg), d is the diameter of the pot (m), V is the ball velocity (m/s) and t is the time of the copulverizing and mixing (s). The amount of the material powder to be treated, the number of balls, the mass of a ball, the diameter of the pot of the planetary type ball mill, the ball velocity and the time of the copulverizing and mixing are suitably adjusted so that the pulverizing power is $4 \times 10^6$ kg·m·s$^{-1}$/kg or more. It is preferred that the ball velocity is in the range from 0.4 to 6.0 m/s and the time of the copulverizing and mixing is in the range from 0.5 to 60 hours.

The ball velocity (V) is obtained from the diameter of the mill (d) and the number of rotation (rpm) by the following equation:

$$V = (d \times \pi \times \text{number of rotation})/60 \ [m/s]$$

wherein V and d have the same meaning as described above.

When the material powder is copulverized and mixed, the condition of the material powder is varied depending on the pulverizing power described above. In general, when the material powder is copulverized and mixed with the pulverizing power of $4 \times 10^6$ kg·m·s$^{-1}$/kg or more, the average diameter of the material powder is 100 μm or smaller, preferably 30 μm or smaller.

The material powder (fine powder) copulverized and mixed as described above is molded and then sintered. In the first of the processes of the invention (Embodiment 1), the material powder (fine powder) thus copulverized and mixed is molded and then sintered with hot isostatic pressing.

In the second of the processes of the invention (Embodiment 2), the material powder (fine powder) copulverized and mixed is presintered, then molded and sintered.

In the third of the processes of the invention (Embodiment 3), the material powder (the micro powder) copulverized and mixed is presintered, then molded and sintered with hot isostatic pressing.

The material powder can be molded at the atmospheric pressure or at a pressure above atmospheric pressure with a pressing means such as a molding press to a desired shape. In the compression molding, a binder component such as polyvinyl alcohol may be added to the material powder according to necessity. The pressure for the molding is different depending on the kind and the diameter of the material powder but generally is in the range from 0.2 to 20 ton/cm² and preferably in the range from 0.5 to 15 ton/cm².

As the method of molding, other suitable kinds of methods, such as extrusion molding, injection molding, coating, screen printing and the like, may be adopted as well as the compression molding described above.

In some of the processes of the invention, the material powder is presintered and then molded. The presintering treatment before the molding is carried out at the atmospheric pressure in an atmosphere of a reducing gas, such as hydrogen, or an inert gas, such as argon, nitrogen, a mixed gas thereof and the like. In the presintering treatment, the temperature of the presintering is adjusted in the range from 50 to 90% (measured by the Celsius's scale) of the maximum temperature of the sintering or to a temperature slightly lower than this range. The temperature pattern of the presintering is generally formed by parallel transfer of the temperature pattern of the sintering to temperatures in the range from 50 to 90% (measured by Celsius's scale) of the sintering temperature or to temperatures slightly lower than this range. The presintering may be carried out at a temperature around the melting temperature of the material powder. The presintering may also be carried out with a temperature pattern in which the basic pattern is kept the same as that of the sintering except for a lowered peak temperature. The material powder thus presintered is molded as described above and then sintered or sintered with hot isostatic pressing.

According to the process of the invention, the thermoelectric material is produced by molding the material powder (fine powder) and then sintering the molded material powder with hot isostatic pressing (Embodiment 1), by presintered the material powder (fine powder), then molding the presintered material powder and sintering the molded material powder (Embodiment 2) or by presintering the material powder (fine powder), then molding the presintered material powder and sintering the molded material powder with hot isostatic pressing (Embodiment 3).

When the material powder is presintered, the copulverized and mixed material powder is presintered and then granulated. The granulated material powder may be classified according to necessity. The granulated material powder (particles) can be molded by pressing to a desired shape by a pressing means such as a molding press without the melt mixing treatment which is generally practiced. In the compression molding, a binder component such as polyvinyl alcohol may be added to the material powder according to necessity in the same manner as described above. The pressure for the molding is different depending on the kind and the diameter of the material powder but generally is in the range from 0.2 to 20 ton/cm² and preferably is in the range from 0.5 ton to 15 ton/cm². As the methods of molding, other suitable kinds of method, such as extrusion molding, injection molding, coating, screen printing and the like, may be adopted as well as the compression molding described above.

In the process of the invention, the material powder is treated with the sintering after the molding. The sintering treatment comprises sintering or sintering with the hot isostatic pressing. The material obtained after the sintering treatment exhibits the desired function of the thermoelectric material.

In the sintering treatment, the material powder molded as described above is sintered at the atmospheric pressure or at pressure above atmospheric pressure. When the material powder is presintered in the preceding process, the sintering treatment with the hot isostatic pressing (the HIP process) gives the thermoelectric material having better properties.

The sintering with the hot isostatic pressing is carried out in an atmosphere of a reducing gas, such as hydrogen, or an inert gas, such as argon, nitrogen, mixed gas thereof and the like. The temperature of the sintering is suitably selected according to the kind and the composition of the material powder and generally is in the range from 200° to 800° C.

When the temperature of the sintering reaches the maximum temperature, the temperature is kept at this temperature for a specified time for sintering to obtain the thermoelectric material of the invention. The time of the sintering is in the range from 0.5 to 30 hours. When the sintering is carried out at a pressure above atmospheric pressure, the isostatic pressing at the pressure in the range from 1,000 to 3,000 kg/cm² is preferred.

As the process of sintering, other processes such as hot pressing process and the like may be utilized as well as the process described above.

In the thermoelectric material of the invention, the components of the material powder form an alloy in which the components are mixed at the atomistic level and the thermoelectric material thus obtained has excellent stability of the thermoelectric property. It also has the uniform sintered structure and attachment of electrodes to the material can be accomplished firmly and effectively.

As described above, by copulverizing and mixing the material powder, then molding the copulverized and mixed material powder and sintering the molded material powder with the hot isostatic pressing, or by presintering the material powder before the molding, then molding the presintered material powder and sintering or sintering with hot isostatic pressing the molded material powder, the solid solution of the sintered product are formed progressively uniformly with progressively uniform morphology and thus the thermoelectric material having excellent properties is obtained.

In the process for production of a thermoelectric element of the invention, a p-type thermoelectric material and an n-type thermoelectric material are produced by suitable combinations of the material powders and thermoelectric elements produced from these thermoelectric materials are combined and utilized.

The p-type thermoelectric material can be produced by selecting the material components so that the material has, for example, the following composition:

$Bi_{(1-u)}Sb_u\cdot Te_{1.5}(0<u<0.95)$.

The n-type thermoelectric material can be produced by selecting the material components so that the material has, for example, the following composition:

$Bi_2\cdot Te_{3(1-v)}\cdot Se_{3v}(0.05<v<0.95)$.

In addition to the selection of the material components as described above, addition of a dopant, such as Br, I, AgI, CuBr, SbI₃, CuI, Te, Se, Sb and the like, in a suitable amount is effective.

Pieces of a pillar-like shape are cut out from the p-type thermoelectric material or the n-type thermoelectric material and the pieces are connected alternately at the upper surfaces and at the lower surfaces with electrodes. Insulating materials are attached to the electrodes to obtain a p-type thermoelectric element and an n-type thermoelectric element.

For producing the p-type thermoelectric element and the n-type thermoelectric element, the p-type thermoelectric material and the n-type thermoelectric material respectively is cut, for example, to a square pillar-like shape having a length of 1 to 5 mm and a section of 1 to 2 mm square. The p-type thermoelectric element and the n-type thermoelectric element are then alternately connected with electrodes of a conductive material having a thickness of 50 to 500 μm. The electrodes are soldered to the thermoelectric elements through a soldering layer, such as a nickel plate of about 70 μm thickness, a Ag-Pd solder of 10 to 500 μm thickness, preferably of 30 μm thickness and the like.

Figure 9:
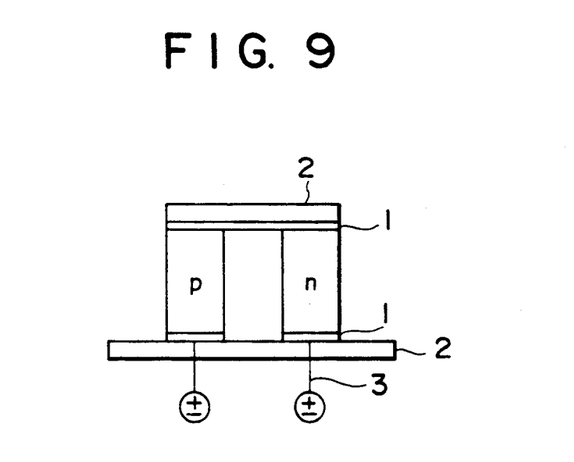
Figure 10:
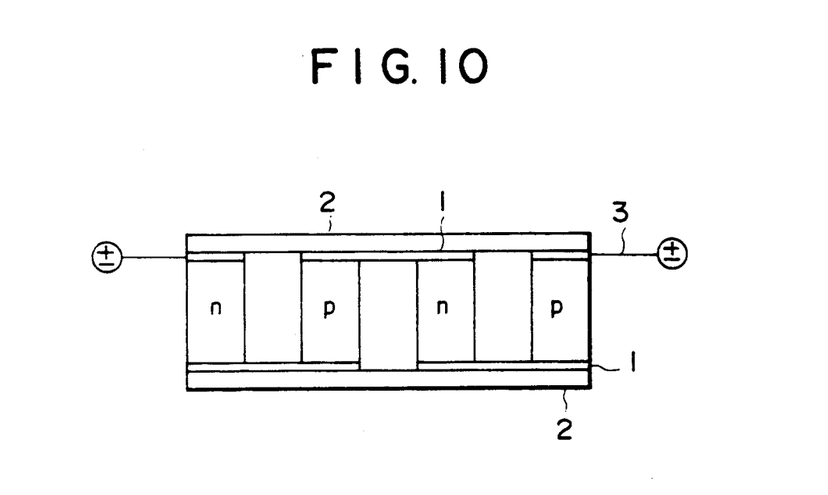

As shown in FIGS. 9 and 10 as examples, the thermoelectric element of the invention can be produced by attaching insulating base plates 2, such as alumina plates of 0.2 to 2 mm thickness, to the surface of electrodes 1 which alternately connect p-type thermoelectric elements (p) and n-type thermoelectric elements (n) and by connecting lead wires 3 to the combined thermoelectric elements at the both ends.

The power of the thermoelectric element thus produced depends on the number of the p-type thermoelectric elements and the n-type thermoelectric elements. Therefore, the number of the thermoelectric elements can be suitably selected according to the desired power of the thermoelectric elements to be produced.

The thermoelectric element of the invention utilizing the thermoelectric material described above has excellent properties and is advantageously utilized for charge coupled devices (CCD), laser diodes, light emitting diodes, infrared detectors, microwave detectors, high resolution spectrophotometers (Si, Ge), CPU chips, LSI chips, parameteric amplifiers, microwave transistor amplifiers, PbEuTe lasers (4 to 5.5 μm), two dimensional CIP arrays, $CO_2$ laser detectors, and $CoMgF_2$ lasers (1.5 to 2.3 μm), cooling of sample holders of powder analysis by X-ray diffractometers, cooling apparatuses for sample holders of Raman spectrophotometers, power generators (portable types and diving types), power generators on vehicles (automobiles, trains and the like), cooling apparatuses and the like applications.

The invention will be understood more readily with reference to the following examples; however, these examples are intended to illustrate the invention and are not to be construed to limit the scope of the invention.

EXAMPLE 1

A material powder comprising $(Bi_2Te_3)_{0.15}(Sb_2Te_3)_{0.85}+Sb$ (5 weight %) was prepared. To 100 g of the material powder, 1 ml/g of ethanol was added and the mixture was copulverized and mixed by using a planetary type ball mill (50 balls having a diameter of 10 mm) at 800 rpm for 20 hours. The material powder thus obtained had the average diameter of about 2 μm.

The copulverized and mixed material powder was molded in a mold of a pillar-like shape having the length of 30 mm and the 5×2 mm rectangular section at the pressure of 2.7 ton/cm² and then sintered with the hot isostatic pressing process (the HIP process) with the sintering pattern having the sintering peak temperature at 500° C. at the pressure of 1,500 kg/cm².G for 2 hours in argon stream to obtain a thermoelectric material. The results of the testing of the properties at the room temperature are shown in Table 1.

COMPARATIVE EXAMPLE 1

A thermoelectric material was obtained by the same method as in Example 1 except that sintering of the material powder was carried out at the atmospheric pressure with the sintering pattern having the sintering peak temperature at 500° C. The results of the testing of the properties at the room temperature are shown in Table 1.

EXAMPLE 2

A material powder comprising $(Bi_2Te_3)_{0.15}(Sb_2Te_3)_{0.85}+Sb$ (1 weight %) was prepared. To 100 g of the material powder, 1 ml/g of ethanol was added and the mixture was copulverized and mixed by using a planetary type wet mill (50 balls having a diameter of 10 mm) at 800 rpm for 20 hours. The material powder thus obtained had the average diameter of about 2 μm.

The copulverized and mixed material powder was charged into a crucible of alumina and presintered at the presintering peak temperature of 500° C. in argon stream.

The calcined material powder was molded in a mold of a pillar-like shape having the length of 30 mm and the 5×2 mm rectangular section at the pressure of 2.7 ton/cm², placed on an Alumina plate and then sintered with the sintering pattern having the sintering peak temperature at 540° C. to obtain a thermoelectric material. The results of the testing of the properties at the room temperature are shown in Table 1.

The compression strength of the thermoelectric material obtained above was measured according to the method of Japanese Industrial Standard R-2206. The results are shown in Table 1.

COMPARATIVE EXAMPLE 2

A thermoelectric material for comparison was obtained by the same method as in Example 2 except that the material powder was treated without the presintering. The results of the testing of the properties at the room temperature are shown in Table 1.

EXAMPLE 3

A thermoelectric material was obtained by the same method as in Example 2 except that a material powder comprising $(Bi_2Te_3)_{0.15}(Sb_2Te_3)_{0.85}+Sb$ (5 weight %) was prepared and used for further treatments in place of the material powder comprising $(Bi_2Te_3)_{0.15}(Sb_2Te_3)_{0.85}+Sb$ (1 weight %) in Example 2. The results of the testing of the properties at the room temperature are shown in Table 1.

EXAMPLE 4

A molded thermoelectric material obtained by the same method as in Example 3 was sintered with the HIP process with the sintering pattern having the peak temperature at 500° C. at the pressure of 1,500 kg/cm².G for 2 hours to obtain a thermoelectric material. The results of the testing of the properties at the room temperature are shown in Table 1.

EXAMPLE 5

A material powder comprising $(Bi_2Te_3)_{0.7}(Bi_2Se_3)_{0.3}+SbI_3$ (0.15 weight %) was prepared. To 100 g of the material powder, 1 ml/g of ethanol was added and the mixture was copulverized and mixed by using a planetary type ball mill (50 balls having a diameter of 10 mm) at 800 rpm for 24 hours. The material powder thus obtained had the average diameter of about 2 μm.

The copulverized and mixed material powder was charged into a crucible of alumina and calcined at the calcination peak temperature of 500° C. in argon stream at the atmospheric pressure.

The presintered material powder was molded in amold of a pillar-like shape having the length of 30 mm and the 5×2 mm rectangular section at the pressure of 2.7 ton/cm² and sintered with the HIP process with the sintering pattern having the peak temperature at 500° C. at the pressure of 1,500 kg/cm²·G for 3 hours in argon stream to obtain a thermoelectric material. The results of the testing of the properties at the room temperature are shown in Table 1.

COMPARATIVE EXAMPLE 3

A material powder obtained by the same method as in Example 5 was sintered with the sintering pattern having the sintering peak temperature at 500° C. to obtain a thermoelectric material. The results of the testing of the properties at the room temperature are shown in Table 1.

EXAMPLE 6

A material powder comprising $(Bi_2Te_3)_{0.7}(Bi_2Se_3)_{0.3}$ +$HgBr_2$ (0.15 weight %) was prepared. To 100 g of the material powder, 1 ml/g of ethanol was added and the mixture was copulverized and mixed by using a planetary type wet ball mill (50 balls having a diameter of 10 mm) at 800 rpm for 20 hours. The material powder thus obtained had the average diameter of about 2 μm.

The copulverized and mixed material powder was charged into a crucible of alumina and presintered at the presintering peak temperature of 500° C. in argon stream at the atmospheric pressure.

The presintered material powder was molded in a mold of a pillar-like shape having the length of 30 mm and the 5×2 mm rectangular section at the pressure of 2.7 ton/cm² and sintered with the HIP process with the sintering pattern having the peak temperature at 500° C. at the pressure of 1,500 kg/cm²·G for 3 hours to obtain a thermoelectric material. The results of the testing of the properties at the room temperature are shown in Table 1.

COMPARATIVE EXAMPLE 4

A material powder obtained by the same method as in Example 6 was sintered with the sintering pattern having the sintering peak temperature at 500° C. to obtain a thermoelectric material. The results of the testing of the properties at the room temperature are shown in Table 1.

TABLE 1

| | Sb wt % | atmosphere | thermoelectric property | | | | compression strength kg/cm² |
|---|---|---|---|---|---|---|---|
| | | | α μV/K | ρ Ω·m | κ W/mk | Z 10⁻³/K | |
| Example 1 | 5.0 | A | 237 | $1.80 \times 10^{-5}$ | 1.4 | 2.23 | — |
| Comparative Example 1 | 5.0 | A | 145 | $3.00 \times 10^{-5}$ | 0.9 | 0.78 | — |
| Example 2 | 1.0 | A | 182 | $2.55 \times 10^{-5}$ | 1.0 | 1.30 | 217 |
| Example 2 | 1.0 | B | 185 | $2.60 \times 10^{-5}$ | 1.0 | 1.32 | 222 |
| Comparaitve Example 2 | 1.0 | B | 160 | $4.40 \times 10^{-5}$ | 0.9 | 0.65 | 182 |
| Example 3 | 5.0 | A | 185 | $2.20 \times 10^{-5}$ | 1.0 | 1.56 | 231 |
| Example 3 | 5.0 | B | 170 | $2.20 \times 10^{-5}$ | 0.9 | 1.50 | 224 |
| Example 4 | 5.0 | A | 201 | $1.10 \times 10^{-5}$ | 1.3 | 2.83 | 195 |
| Example 5 | — | A | −189 | $1.25 \times 10^{-5}$ | 1.36 | 2.10 | — |
| Comparative Example 3 | — | A | −190 | $1.76 \times 10^{-5}$ | 1.21 | 1.70 | — |
| Example 6 | — | A | −171 | $1.21 \times 10^{-5}$ | 1.34 | 1.80 | — |
| Comparative Example 4 | — | A | −165 | $1.78 \times 10^{-5}$ | 1.14 | 1.34 | — |

In Table 1, A means that the thermoelectric material was sintered in argon stream, B means that the thermoelectric material was placed on a Alumina plate in a crucible and then sintered and Z (the figure of merit)-=$α^2·σ/κ$ wherein α is Seebeck coefficient, σ is electric conductivity and κ is thermal conductivity.

The results in Table 1 show that the thermoelectric materials of the invention have a much superior figure of merit to those of the materials of Comparative Examples. Thus, advantageous effects of the process of the invention comprising the hot isostatic pressing and the presintering of the material powder are clearly demonstrated.

Figure 1:
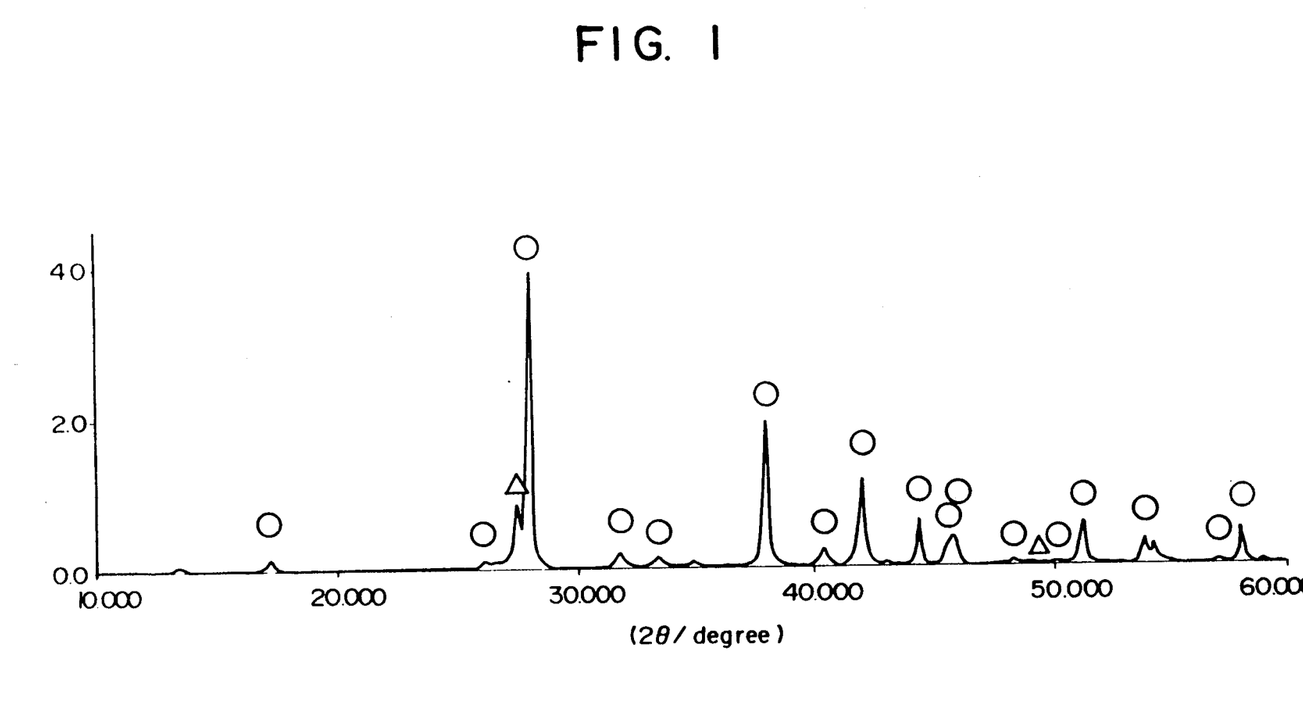
FIG. 1 shows an X-ray diffraction pattern of the material powder treated with calcination in Example 3.
Figure 2:
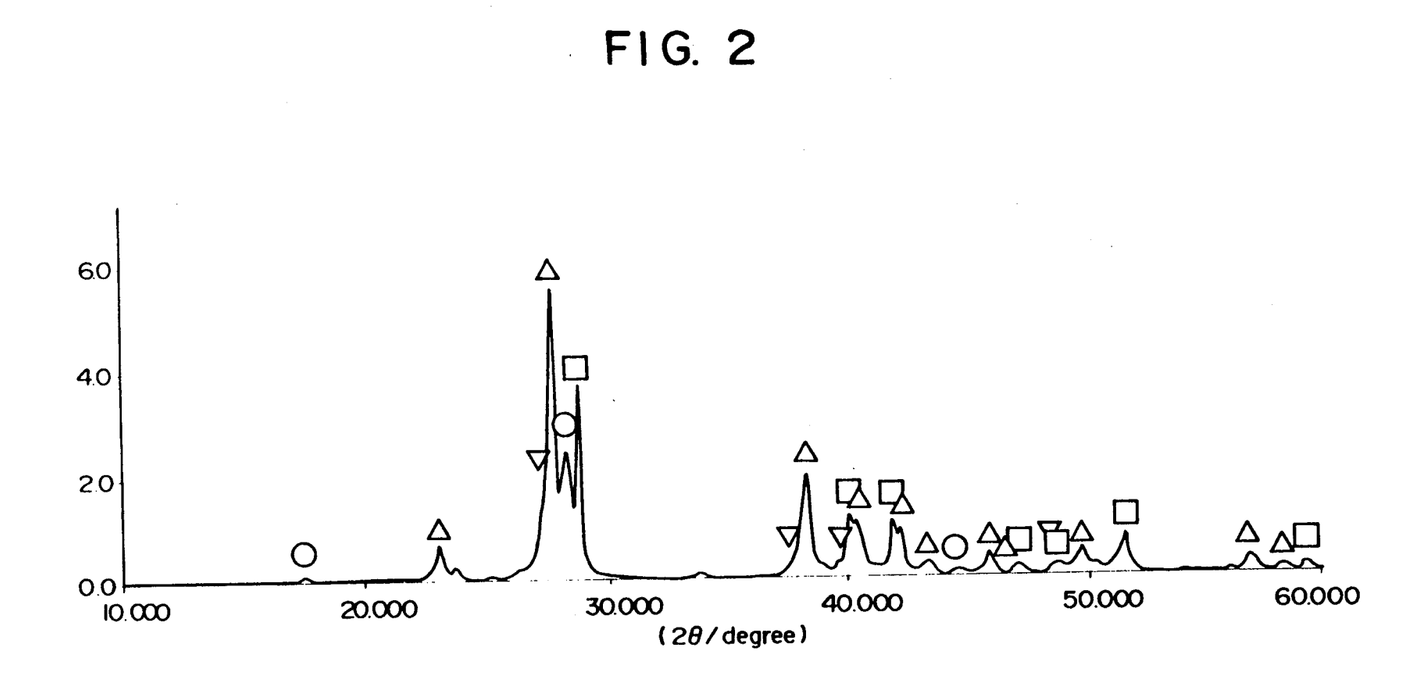
FIG. 2 shows an X-ray diffraction pattern of the material powder in Comparative Example 1.

For the purpose of still more clearly demonstrating the effect of the process of the invention, the X-ray diffraction pattern of the material powder treated with the calcination in Example 3 and the X-ray diffraction pattern of the material powder without presintering in Comparative Example 3 are shown in FIG. 1 and FIG. 2 respectively.

In the X-ray diffraction pattern of FIG. 1, the diffraction by the alloy of Bi-Te-Sb can be detected and the formation of the solid solution as the precursor by the presintering of the material powder is shown. In contrast to this, no peak by the solid solution can be found in the X-ray diffraction pattern of FIG. 2 of the Comparative Example and the simple mixing of the components is shown. The effect of the process of the invention is clearly shown in these figures as well.

For the purpose of still more clearly demonstrating the effect of the process of the invention, morphologies of the secondary particles in the material powder treated with the presintering in Example 3 and in the material powder without the presintering in Comparative Example 1 were observed by the SEM photography. Structures of the surface part and the inner part of the thermoelectric elements prepared by using the two kinds of the thermoelectric materials described above were observed by the SEM photography as well. The results are shown in FIGS. 3 to 8.

Figure 3:
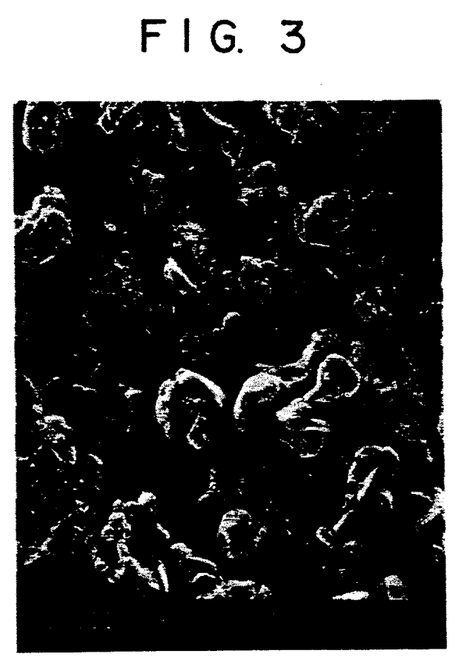
FIG. 3 is a SEM (scanning electron microscope) photograph of particles of the material powder treated with calcination in Example 3.
Figure 4:
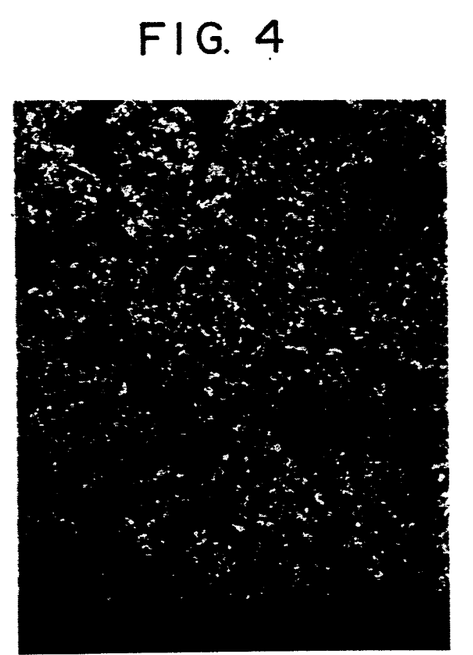
FIG. 4 is a SEM photograph of particles of the material powder in Comparative Example 1.
Figure 5:
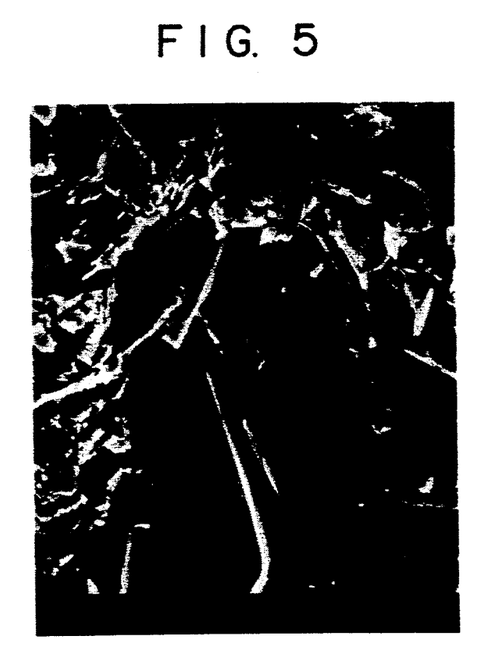
FIG. 5 is a SEM photograph showing surface morphology of the thermoelectric material produced by using the material powder treated with calcination in Example 3.
Figure 6:
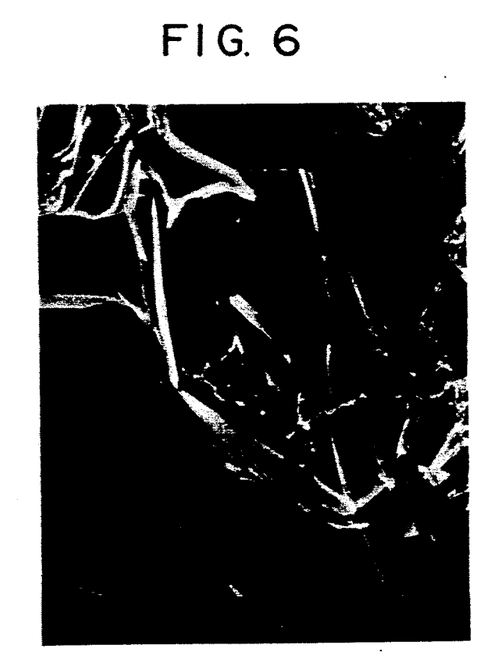
FIG. 6 is a SEM photograph showing the structure of the inner part of the thermoelectric material produced by using the material powder treated with calcination in Example 3.
Figure 7:
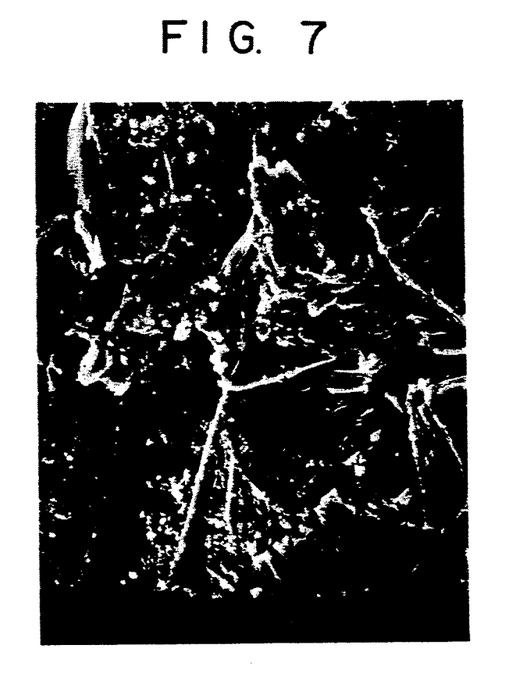
FIG. 7 is a SEM photograph showing surface morphology of the thermoelectric material produced by using the material powder in Comparative Example 1.
Figure 8:
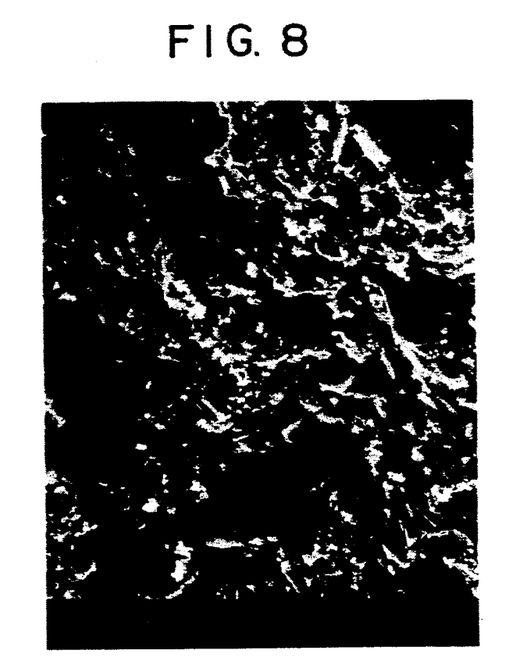
FIG. 8 is a SEM photograph showing the structure of the inner part of the thermoelectric material produced by using the material powder in Comparative Example 1 and FIG. 9 and FIG. 10 are schematic diagrams showing examples of the thermoelectric element of the invention.

The secondary particles in the SEM photograph of FIG. 3 show that the particles in the material powder prepared with the presintering in Example 3 grew larger and were made more uniform while the particles in the SEM photograph of FIG. 4 show that the particles in the material powder prepared without presintering did not show this phenomenon.

EXAMPLE 7

A material powder comprising $(Bi_2Te_3)_{0.15}(Sb_2Te_3)_{0.85}+Sb$ (5 weight %) was prepared. To 100 g of the material powder, 1 ml/g of ethanol was added and the mixture was copulverized and mixed by using a planetary type ball mill (50 balls having a diameter of 10 mm) at 800 rpm for 20 hours. The material powder thus obtained had the average diameter of about 2 μm.

The copulverized and mixed powder material was molded in a mold having the thickness of 10 mm and the 50 mm square section at the pressure of 2.7 ton/cm² and then sintered with the hot isostatic pressing process (the HIP process) with the sintering pattern having the sintering peak temperature at 500° C. at the pressure of 1,500 kg/cm²·G for 2 hours in argon stream to obtain a p-type thermoelectric material.

An n-type thermoelectric material was obtained by the same method as described above except that a material powder comprising $(Bi_2Te_3)_{0.7}(Bi_2Se_3)_{0.3}$ was used.

For evaluation of the quality of the p-type thermoelectric material and the n-type thermoelectric material thus obtained, thermoelectric properties at the room temperature were measured. The results are shown in Table 2.

Each of the p-type thermoelectric material and the n-type thermoelectric material were cut into pieces of a pillar-like shape having the length of 9 mm and the section of 5 mm square. The upper surfaces and the lower surfaces of the pillar-like pieces were plated with nickel. A Ag-Pd solder paste was applied to the plated surfaces and electric insulating base plates were arranged as shown in FIG. 9 to prepare a thermoelectric element. Compression strength (with the vertical load) was measured and an accelerated life test (degradation property) was made. The results are shown in Table 3.

COMPARATIVE EXAMPLE 5

Specified amounts of bismuth, tellurium and antimony (335.64 g, 586.602 g and 1229.63 g, respectively) were weighed and mixed. The material powder thus prepared was charged into a quartz tube and the tube was sealed after the air in the tube was removed by a vacuum pump.

The sealed tube was heated to 650° C. and reaction was allowed to proceed by mixing the content of the tube for 3 hours. Then, the tube was moved to an area of the temperature of 560° C. which is close to the solidifying temperature of the material and cooled rapidly to obtain an ingot.

The ingot thus obtained was pulverized by a stamping mill and classified to the particle size of 26 to 74 μm. These powders were hot pressed with a carbon dice by the hot press method at 500° C. and 800 kg/cm²·G while they were pressed to one direction in a vacuum to obtain a p-type sintered product.

An n-type sintered product was obtained by the same method as described above except that specified amounts of bismuth, tellurium, antimony and antimony iodide (313.5 g, 272.77 g, 8.883 g and 0.00837 g, respectively) were used and that the powders from the ingot were sintered by hot pressing at 550° C.

For evaluation of the quality of the p-type thermoelectric material and the n-type thermoelectric material thus obtained, thermoelectric properties at the room temperature were measured. The results are shown in Table 2.

A thermoelectric element was prepared by the same method as in Example 7 from the p-type sintered product and the n-type sintered product. Compression strength (with the vertical load) was measured and an accelerated life test (degradation property) was made. The results are shown in Table 3.

EXAMPLE 8

Thermoelectric materials were prepared by the same method as in Example 7 except that neither the p-type thermoelectric material nor the n-type thermoelectric material was treated by presintered.

For evaluation of the quality of the p-type thermoelectric material and the n-type thermoelectric material obtained, thermoelectric properties at the room temperature were measured. The results are shown in Table 2.

A thermoelectric element was prepared by the same method as in Example 7 from the p-type sintered product and the n-type sintered product. Compression strength (with the vertical load) was measured and an accelerated life test (degradation property) was made. The results are shown in Table 3.

TABLE 2

| | | thermoelectric property | | | |
|---|---|---|---|---|---|
| | type | $\alpha$ μV/K | $\rho$ Ω·m | $\kappa$ W/mk | Z $10^{-3}$/K |
| Example 7 | p | 201 | $1.10 \times 10^{-5}$ | 1.30 | 2.83 |
| Example 7 | n | −165 | $1.31 \times 10^{-5}$ | 0.98 | 2.10 |
| Comparative Example 5 | p | 195 | $1.15 \times 10^{-5}$ | 1.46 | 2.28 |
| Comparative Example 5 | n | −185 | $1.21 \times 10^{-5}$ | 1.35 | 2.10 |
| Example 8 | p | 237 | $1.80 \times 10^{-5}$ | 1.40 | 2.23 |
| Example 8 | n | −185 | $1.50 \times 10^{-5}$ | 1.13 | 2.01 |

TABLE 3

| | compression strength (kg/cm²) | life (hours) |
|---|---|---|
| Example 7 | 788 | 5770 |
| Comparative Example 5 | 492 | 3780 |
| Example 8 | 796 | 5660 |

In Table 2, Z (the figure of merit), $\sigma$ and $\kappa$ has the same meaning as in Table 1. In the accelerated life test, time elapsed before the initial cooling ability of Δ T becomes 95% was measured ($Th_{hot}=300K$).

The results in Table 3 show that the thermoelectric materials of the invention have much superior property indices to those of the materials of Comparative Examples. Thus, advantageous effects of the process of the invention comprising the hot isostatic pressing and the presentering of the material powder are clearly demonstrated.

While the invention has been particularly shown and described with reference to preferred embodiments thereof, it will be understood by those skilled in the art that the foregoing and other changes in form and details can be made therein without departing from the spirit and scope of the invention.

What is claimed is:

1. A process for producing a thermoelectric material which comprises presintering a material powder comprising two or more elements selected from the group consisting of bismuth, tellurium, antimony and selenium and having an average diameter of 0.05 to 100 μm, molding the presintered material powder and sintering the molded material powder.

2. A process for producing a thermoelectric material which comprises presintering a material powder comprising two or more elements selected from the group consisting of bismuth, tellurium, antimony and selenium and having an average diameter of 0.05 to 100 μm, molding the calcined material powder and sintering the molded material powder by hot isostatic pressing.

3. The process for producing a thermoelectric material as claimed in claim 1 wherein the material powder comprises a solid solution powder which is selected from the group consisting of $Bi_2Te_3$, $Sb_2Te_3$ and $(Bi_2Te_3)_x(Sb_2Te_3)_y$, wherein $x+y=1$, $0<x<1$ and $0<y<1$.

4. The process for producing a thermoelectric material as claimed in claim 2 wherein the material powder comprises a solid solution powder which is selected from the group consisting of $Bi_2Te_3$, $Sb_2Te_3$ and $(Bi_2Te_3)_3(SB_2Te_3)_y$, wherein $x+y=1$, $0<x<1$ and $0<y<1$.

5. The process for producing a thermoelectric material as claimed in claim 1 wherein the material powder comprises a solid solution powder which is selected from the group consisting of $Bi_2Se_3$ and $(Bi_2Te_3)_x(Bi_2Se_3)_y$, wherein $x+y=1$, $0<x<1$ and $0<y<1$.

6. The process for producing a thermoelectric material as claimed in claim 2 wherein the material powder comprises a solid solution powder which is selected from the group consisting of $Bi_2Se_3$ and $(Bi_2Te_3)_x(Bi_2Se_3)_y$, wherein $x+y=1$, $0<x<1$ and $0<y<1$.

7. The process for producing a thermoelectric material as claimed in claim 1 wherein the presintering of the material powder is carried out at a temperature of 50 to 90% of the maximum temperature of the sintering of the molded material powder.

8. The process for producing a thermoelectric material as claimed in claim 2 wherein the presintering of the material powder is carried out at a temperature of 50 to 90% of the maximum temperature of the sintering of the molded material powder.

9. The process for producing a thermoelectric material as claimed in claim 1 wherein the presintering of the material powder is carried out at a temperature such that a temperature pattern of the presintering is formed by parallel transfer of a temperature pattern of the sintering to temperatures, measured by the Celsius scale, in a range of 50 to 90% of the sintering temperature or to temperatures slightly lower than said range.

10. The process for producing a thermoelectric material as claimed in claim 2 wherein the calcination of a material powder is carried out at a temperature close to the melting temperature of the material powder.

11. The process for producing a thermoelectric material as claimed in claim 2 wherein the sintering of the molded material powder with hot isostatic pressing is carried out at a temperature in the range from 200° to 800° C. for a time in the range from 0.5 to 30 hours under a pressure in the range from 1,000 to 8,000 kg/cm².

12. A process for producing a thermoelectric element which comprises
   (a) cutting out pieces, each piece having an upper face and a lower face, of a pillar-like shape from each of a p-type thermoelectric material and an n-type thermoelectric material,
   (b) connecting the pieces cut out from the p-type thermoelectric material and the pieces cut out from the n-type thermoelectric material, alternately, with electrodes having surfaces at the upper faces or the lower faces of the pieces and
   (c) attaching insulating base plates to the surfaces of the electrodes,
   the p-type thermoelectric material and the n-type thermoelectric material being individually produced by presintering a material powder comprising two or more elements selected from the group consisting of bismuth, tellurium, antimony and selenium, copulverizing and mixing the calcined material powder, molding the copulverized and mixed material powder and sintering the molded material powder by hot isostatic pressing.

13. The process for producing a thermoelectric material as claimed in claim 3 wherein the average diameter of the material powder is 0.05 to 30 μm; and the molding being carried out at a pressure of 0.2 to 20 ton/cm².

14. The process for producing a thermoelectric material as claimed in claim 4 wherein the average diameter of the material powder is 0.05 to 30 μm; and the molding being carried out at a pressure of 0.2 to 20 ton/cm².

15. The process for producing a thermoelectric element as claimed in claim 12 wherein the copulvering and mixing are carried out simultaneously in a planetary ball mill at a pulverizing powder of $5 \times 10^6$ to $2 \times 10^7$ kg·m·s$^{-1}$/kg for a period of time of 0.5 to 60 hours.

16. The process for producing a thermoelectric element as claimed in claim 12 wherein the p-type thermoelectric material has a composition of $Bi_{(1-v)}Sb_v.Te_{1.5}$, wherein $0<v<0.95$, the n-type thermoelectric material has a composition of $Bi_2Te_{3(1-v)}.Se_{3v}$, wherein $0.05<v0.95$, the pillar-like shape being a square shape with a length of 1 to 5 mm and a width of 1 to 2 mm; the electrodes having a thickness of 50 to 500 μm and the alumina plates having a thickness of 0.2 to 2 mm.

* * * * *